United States Patent
Chang et al.

(10) Patent No.: US 8,390,501 B2
(45) Date of Patent: Mar. 5, 2013

(54) SUCCESSIVE APPROXIMATION REGISTER ADC WITH A WINDOW PREDICTIVE FUNCTION

(75) Inventors: Soon-Jyh Chang, Tainan (TW);
Guan-Ying Huang, Tainan (TW);
Chun-Cheng Liu, Tainan (TW);
Chung-Ming Huang, Tainan (TW);
Jin-Fu Lin, Tainan (TW); Chih-Haur Huang, Tainan (TW)

(73) Assignees: NCKU Research and Development Foundation, Tainan (TW); Himax Technologies Limited, Tainan (TW); Himax Media Solutions, Inc., Tainan (TW)

( * ) Notice: Subject to any disclaimer, the term of this patent is extended or adjusted under 35 U.S.C. 154(b) by 110 days.

(21) Appl. No.: 13/096,908

(22) Filed: Apr. 28, 2011

(65) Prior Publication Data

US 2012/0274489 A1 Nov. 1, 2012

(51) Int. Cl.
*H03M 1/34* (2006.01)
(52) U.S. Cl. .......................... 341/163; 341/172; 341/155
(58) Field of Classification Search .................. 341/158, 341/172, 155, 163
See application file for complete search history.

(56) References Cited

U.S. PATENT DOCUMENTS

| | | | | |
|---|---|---|---|---|
| 6,064,328 A | * | 5/2000 | Scheidig et al. | 341/155 |
| 7,233,273 B2 | * | 6/2007 | Tachibana et al. | 341/155 |
| 7,432,844 B2 | * | 10/2008 | Mueck et al. | 341/163 |
| 7,965,216 B1 | * | 6/2011 | Petre et al. | 341/155 |
| 2010/0026546 A1 | * | 2/2010 | Ohnhaeuser et al. | 341/172 |
| 2010/0188277 A1 | * | 7/2010 | Aruga et al. | 341/158 |

* cited by examiner

*Primary Examiner* — Jean B Jeanglaude
(74) *Attorney, Agent, or Firm* — Stout, Uxa, Buyan & Mullins, LLP (57) ABSTRACT

A successive approximation register (SAR) analog-to-digital converter (ADC) is disclosed. A first and second capacitor DACs receive a first and second input signals respectively. A first coarse comparator compares an output of the first capacitor DAC with a window reference voltage, a second coarse comparator compares an output of the second capacitor DAC with the window reference voltage, and a fine comparator compares the output of the first capacitor DAC with the output of the second capacitor DAC. A SAR controller receives outputs of the first and second coarse comparators to determine whether the outputs of the first and second capacitor DACs are within a predictive window determined by the window reference voltage. The SAR controller bypasses at least one phase of analog-to-digital conversion of the SAR ADC when the outputs of the first capacitor DAC and the second capacitor DAC are determined to be within the predictive window. The SAR controller decodes the outputs of the first and second coarse comparators and the fine comparator to obtain a converted output of the SAR ADC.

13 Claims, 8 Drawing Sheets

| | $B_{xp}$ | $\overline{B_{xn}}$ | State |
|---|---|---|---|
| $V_{ip}>V_r$<br>$V_{in}<V_r$ | 1 | 1 | No shift |
| $V_{ip}>V_r$<br>$V_{in}>V_r$ | 1 | 0 | shift |
| $V_{ip}<V_r$<br>$V_{in}>V_r$ | 0 | 0 | No shift |

FIG.4

|   |   |   |   | $B_5$ | $B_6$ | $B_7$ | $B_8$ | $B_9$ | $B_{10}$ |
|---|---|---|---|---|---|---|---|---|---|
|   | $\overline{B_{1n}}$ | $\overline{B_{2n}}$ | $\overline{B_{3n}}$ | $\overline{B_{4n}}$ | | | | | |
| + | $\overline{B_{1p}}$ | $\overline{B_{2p}}$ | $\overline{B_{3p}}$ | $\overline{B_{4p}}$ | | | | | |
| $D_1$ | $D_2$ | $D_3$ | $D_4$ | $D_5$ | $D_6$ | $D_7$ | $D_8$ | $D_9$ | $D_{10}$ |

| Power | Without Predictive Window | With Predictive Window |
|---|---|---|
| Analog | 26.6 | 25.2 |
| Digital | 46.1 | 39.2 |
| DAC | 19.5 | 11.6(10.1+1.5) |
| Total | 92.2($\mu$W) | 76.0($\mu$W) |

SUCCESSIVE APPROXIMATION REGISTER ADC WITH A WINDOW PREDICTIVE FUNCTION

BACKGROUND OF THE INVENTION

1. Field of the Invention

The present invention generally relates to a successive approximation register (SAR) analog-to-digital converter (ADC), and more particularly to a SAR ADC with a window predictive function.

2. Description of Related Art

A successive approximation register (SAR) analog-to-digital converter (ADC) is a type of ADC that converts an analog signal to a digital equivalent of the signal. The SAR ADC performs conversion by comparison and searching through all possible quantization levels to obtain a digital output. The SAR ADC requires less silicon area and the associated cost than other ADC architectures. However, the SAR ADC needs more cycles to obtain the digital output, and therefore does not fit for high speed applications.

Some conventional methods are proposed to speed up the operation of the SAR ADC. One of the conventional methods is to tolerate settling error in phases of comparison, however, at the cost of its linearity.

Moreover, although the SAR ADC consumes less power than other ADC architectures, its power consumption is still too high to be adapted to some electronic devices that has limited power source.

For the foregoing reasons, a need has arisen to propose a novel SAR ADC that can speed up the operation without sacrificing its linearity.

SUMMARY OF THE INVENTION

In view of the foregoing, it is an object of the embodiment of the present invention to provide a SAR ADC with a window predictive function by tolerating the settling error in phases of comparison. The embodiment is capable of speeding up the operation and reducing power consumption. Moreover, the embodiment can solve incomplete settling problem and improve its linearity.

According to one embodiment, the SAR ADC includes a first capacitor digital-to-analog converter (DAC), a second capacitor DAC, a first coarse comparator, a second coarse comparator, a fine comparator, and a SAR controller. The first capacitor DAC is coupled to receive a first input signal, and the second capacitor DAC is coupled to receive a second input signal. The first coarse comparator is configured to compare an output of the first capacitor DAC with a window reference voltage, the second coarse comparator is configured to compare an output of the second capacitor DAC with the window reference voltage, and the fine comparator is configured to compare the output of the first capacitor DAC with the output of the second capacitor DAC. The SAR controller is coupled to receive outputs of the first coarse comparator and the second coarse comparator to determine whether the outputs of the first capacitor DAC and the second capacitor DAC are within a predictive window determined by the window reference voltage. The SAR controller bypasses at least one phase of analog-to-digital conversion of the SAR ADC when the outputs of the first capacitor DAC and the second capacitor DAC are determined to be within the predictive window. The SAR controller decodes the outputs of the first coarse comparator, the second coarse comparator and the fine comparator to obtain a converted output of the SAR ADC.

DETAILED DESCRIPTION OF THE INVENTION

Figure 1:
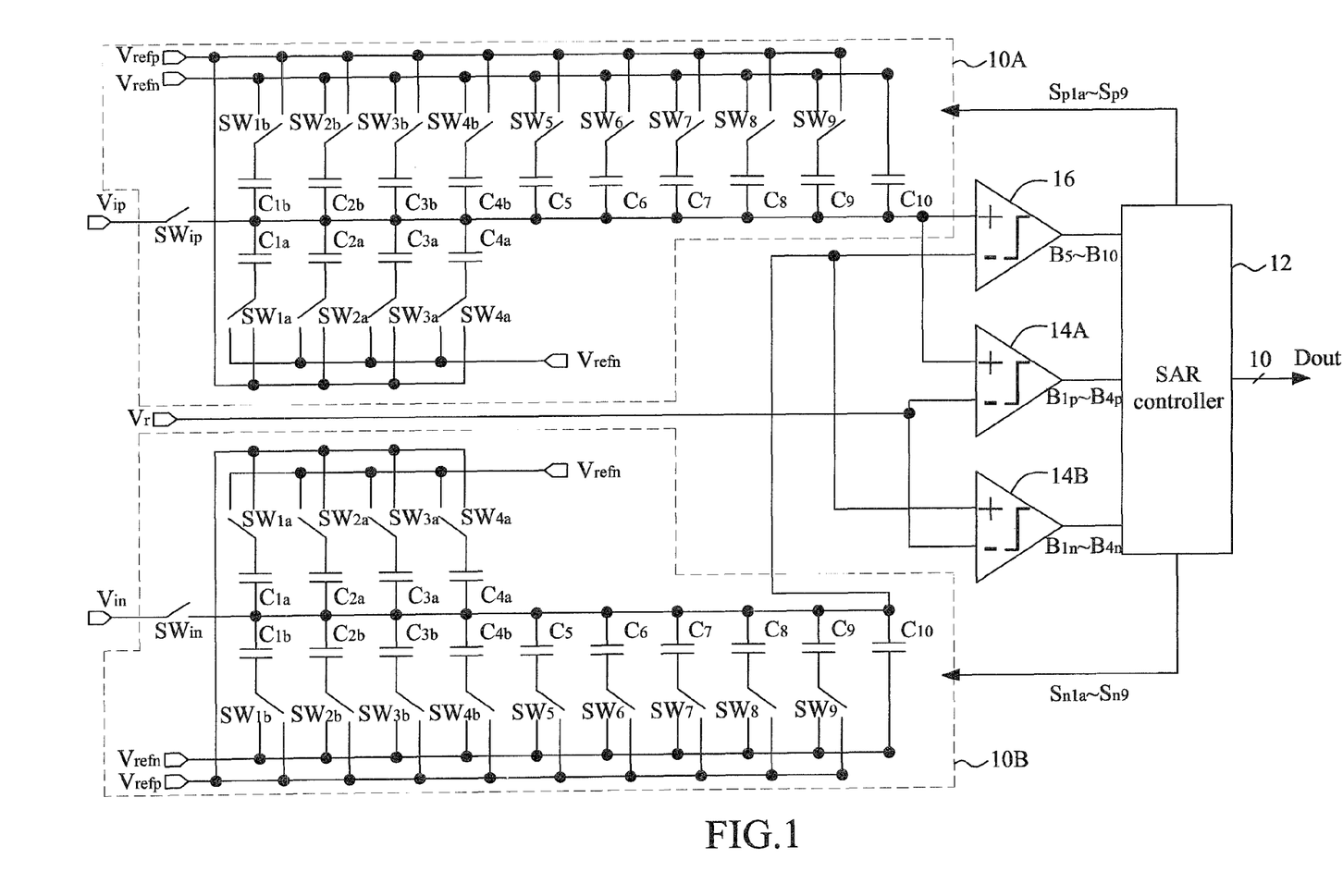
FIG. 1 shows a circuit diagram illustrative of a successive approximation register (SAR) analog-to-digital converter (ADC) with a window predictive function according to one embodiment of the present invention.

FIG. 1 shows a circuit diagram illustrative of a successive approximation register (SAR) analog-to-digital converter (ADC) with a window predictive function according to one embodiment of the present invention. Although a 10-bit SAR ADC with a 5-bit predictive window is illustrated in the embodiment, an n-bit SAR ADC with an m-bit predictive window (m<n) may be generally constructed according to the present invention, where the m most significant bits (MSBs) of the SAR ADC correspond to the predictive window and other n-m bits correspond to least significant bits (LSBs).

In the embodiment, the SAR ADC includes a first capacitor digital-to-analog converter (DAC) 10A and a second capacitor DAC 10B that are coupled to receive a first input signal $V_{ip}$ and a second input signal $V_{in}$ respectively. Specifically, the first capacitor DAC 10A includes an array of individually switched capacitors $C_{1a}$ to $C_{10}$. Two capacitors are used for each of m−1 phases for obtaining the m MSBs (i.e., $D_1$ to $D_5$), and one capacitor is used for each of m+1 phases for obtaining the n-m LSBs (i.e., $D_6$ to $D_{10}$). For example, the capacitors $C_{1a}$ and $C_{1b}$ are used for the phase 1 for obtaining MSB $D_2$, and the capacitor $C_6$ is used for the phase 6 for obtaining LSB $D_6$. First ends of all the capacitors $C_{1a}$ to $C_{10}$ are coupled to the first input signal $V_{ip}$ via a switch $SW_{ip}$, and second ends of the capacitors $C_{1a}$ to $C_9$ may be switched to either a first reference voltage $V_{refp}$ (e.g., a positive reference voltage) or a second reference voltage $V_{refn}$ (e.g., a negative reference voltage). The second ends of the capacitors $C_{10}$ is switched to a second reference voltage $V_{refn}$. The switching of the capacitors $C_{1a}$-$C_9$ is controlled by switches $SW_{1a}$-$SW_9$ respectively, which are further controlled by switching signals $S_{p1a}$-$S_{p9}$ provided by a SAR controller 12. The second capacitor DAC 10B has the same composition and configuration as the first capacitor DAC 10A except that the first ends of the capacitors $C_{1a}$ to $C_{10}$ are coupled to the second input signal $V_{in}$ via a switch $SW_{in}$. In the embodiment, the capacitors $C_{1a}$ to $C_{10}$ have, but are not being limited to, weighted values as follows: $C_{1a}=C_{1b}=2C_{2a}=2C_{2b}=4C_{3a}=4C_{3b}=8C_{4a}=8C_{4b}=8C_5=16C_6=32C_7=64C_8=128C_9=128C_{10}$.

Before entering a converting phase, the SAR ADC is subjected to a sampling phase, in which the first capacitor DAC 10A and the second capacitor DAC 10B are coupled to receive the first input signal $V_{ip}$ and the second input signal $V_{in}$ via the switch $SW_{ip}$ and the switch $SW_{in}$ respectively. The second ends of each capacitor pair, such as $C_{1a}$ and $C_{1b}$, are coupled to different reference voltages. For example, the capacitor $C_{1b}$ is coupled to the first reference voltage $V_{refp}$ and the capacitor $C_{1a}$ is coupled to the second reference voltage $V_{refn}$.

In the embodiment, the SAR ADC also includes two coarse comparators—a first coarse comparator 14A and a second coarse comparator 14B. Specifically, during phases for performing analog-to-digital conversion with respect to the m MSBs, the first coarse comparator 14A compares the output (e.g., the node coupled to the first ends of the capacitors $C_{1a}$-$C_{10}$) of the first capacitor DAC 10A with a window reference voltage $V_r$, which may decide the size of the predictive window. For example, the first coarse comparator 14A includes a first differential operational amplifier that is coupled to receive the output of the first capacitor DAC 10A at a non-inverting input node, and is coupled to receive the window reference voltage $V_r$ at an inverting input node. The outputs $B_{1p}$-$B_{4p}$ obtained in the phases 1-4 for obtaining the MSBs $D_2$-$D_5$ from the first coarse comparator 14A are fed to the SAR controller 12. Similarly, during phases for performing analog-to-digital conversion with respect to the m MSBs, the second coarse comparator 14B compares the output (e.g., the node coupled to the first ends of the capacitors $C_{1a}$-$C_{10}$) of the second capacitor DAC 10B with the window reference voltage $V_r$. For example, the second coarse comparator 14B includes a second differential operational amplifier that is coupled to receive the output of the second capacitor DAC 10B at a non-inverting input node, and is coupled to receive the window reference voltage $V_r$ at an inverting input node. The outputs $B_{1n}$-$B_{4n}$ obtained in the phases 1-4 for obtaining the MSBs $D_2$-$D_5$ from the second coarse comparator 14B are fed to the SAR controller 12.

In the embodiment, the SAR ADC further includes a fine comparator 16 that, during phases for performing analog-to-digital conversion with respect to the n-m LSBs, compares the output of the first capacitor DAC 10A with the output of the second capacitor DAC 10B. For example, the fine comparator 16 includes a third differential operational amplifier that is coupled to receive the output of the first capacitor DAC 10A at a non-inverting input node, and is coupled to receive the output of the second capacitor DAC 10B at an inverting input node. The outputs $B_5$-$B_{10}$ obtained in the phases 5-10 from the fine comparator 16 are fed to the SAR controller 12. According to the outputs of the first coarse comparators 14A and the second coarse comparator 14B, the SAR controller 12 may determine whether the outputs of the first capacitor DAC 10A and the second capacitor DAC 10B are within the predictive window, and accordingly control the switching of the capacitors $C_{1a}$-$C_9$ by switching the switches $SW_{1a}$-$SW_9$ via the switching signals $S_{p1a}$-$S_{p9}$. The SAR controller 12 further decodes the outputs $B_{1p}$-$B_{4p}$ of the first coarse comparator 14A, the outputs $B_{1n}$-$B_{4n}$ of the second coarse comparator 14B and the outputs $B_5$-$B_{10}$ of the fine comparator 16 to obtain a converted output $D_{out}$ of the SAR ADC.

Figure 2:
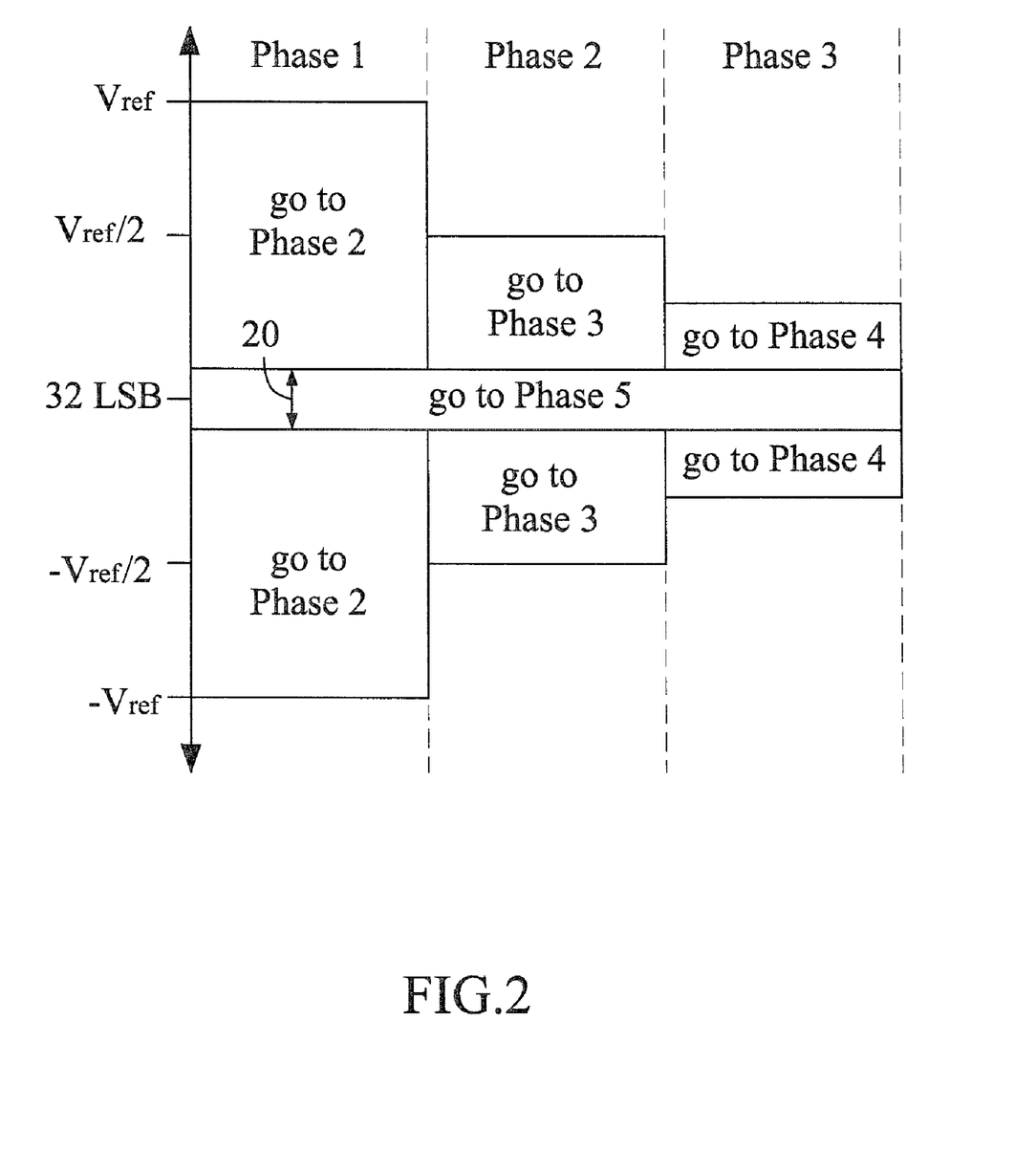
FIG. 2 shows a schematic phase timing diagram illustrating the first three phases of operating the SAR ADC of FIG. 1.

FIG. 2 shows a schematic phase timing diagram illustrating the first three phases of operating the SAR ADC of FIG. 1. While performing analog-to-digital conversion corresponding to the MSBs, if the first input signal $V_{ip}$ and the second input signal $V_{in}$ (or the outputs of the first capacitor DAC 10A and the second capacitor DAC 10B) are determined (by the SAR controller 12) to be within the predictive window 20, the analog-to-digital conversion may go directly to the phase 5 corresponding to the LSB out of the predictive window. Otherwise, the analog-to-digital conversion goes to the next phase.

Figure 3:
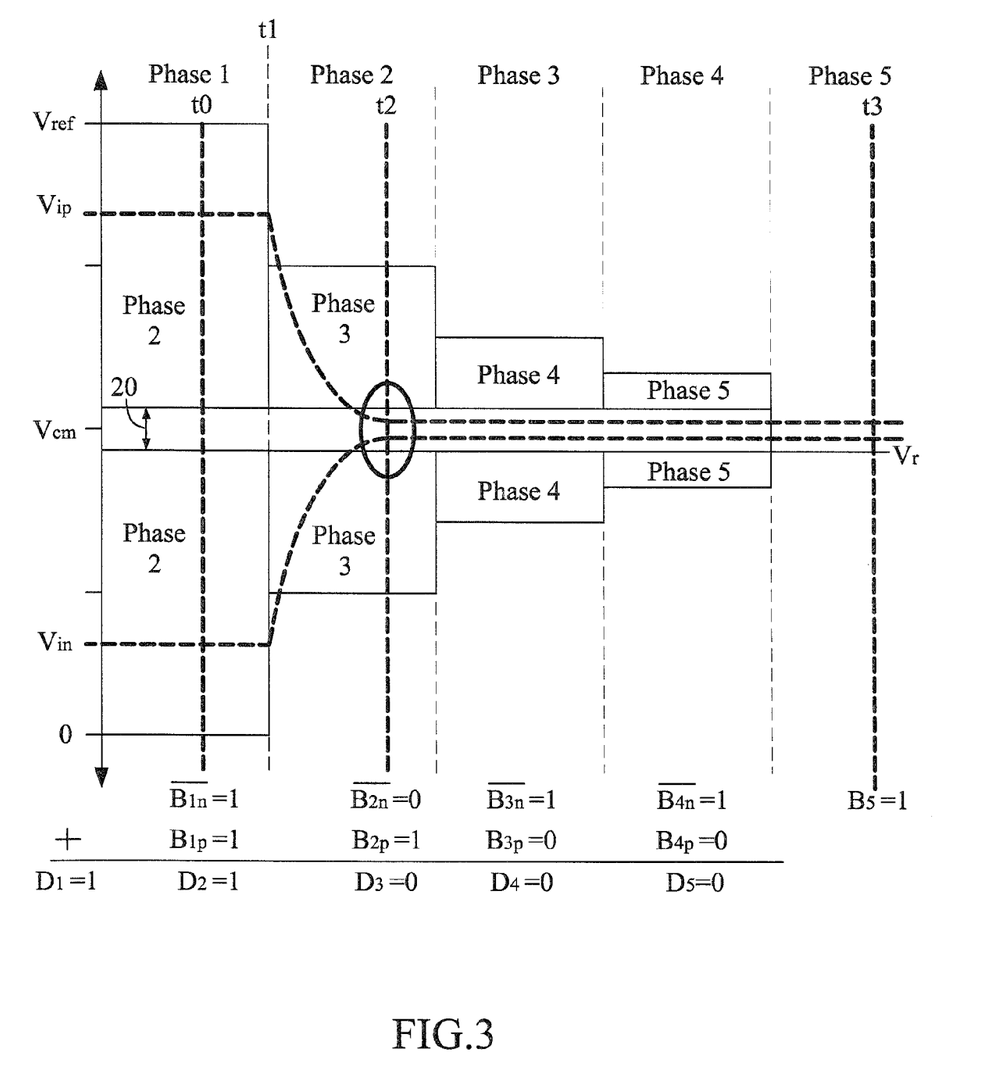
FIG. 3 shows an exemplary phase timing diagram and corresponding outputs of the first coarse comparator, the second coarse comparator, and the fine comparator of FIG. 1.

FIG. 3 shows an exemplary phase timing diagram and corresponding outputs $B_{1p}$-$B_{4p}$ of the first coarse comparator 14A, the outputs $B_{1n}$-$B_{4n}$ of the second coarse comparator 14B and the output $B_5$ of the fine comparator 16. It is observed that, at time t0 of the phase 1, the output $B_{1p}$ of the first coarse comparator 14A has a logic value of 1 and the output $B_{1n}$ of the second coarse comparator 14B has a logic value of 0 (or $\overline{B}_{1P}=1$). The SAR controller 12 accordingly determines that the first input signal $V_{ip}$ and the second input signal $V_{in}$ are not within the predictive window 20, and, therefore, the analog-to-digital conversion goes to the next phase 2.

Upon entering the phase 2, at time t1, as the output of the first capacitor DAC 10A has been determined to be greater than the window reference voltage $V_r$, the capacitor $C_{1a}/C_{1b}$ that is initially switched to the first reference voltage $V_{refp}$ of the first capacitor DAC 10A is now switched to the second reference voltage $V_{refn}$, thereby decreasing the amplitude of the output of the first capacitor DAC 10A as shown. On the other hand, at the same time t1, as the output of the second capacitor DAC 10B has been determined to be less than the window reference voltage $V_r$, the capacitor $C_{1a}/C_{1b}$ that is initially switched to the second reference voltage $V_{refn}$ of the second capacitor DAC 10B is now switched to the first reference voltage $V_{refp}$, thereby increasing the amplitude of the output of the second capacitor DAC 10B as shown. According to the switching as described, the outputs of the first capacitor DAC 10A and the second capacitor DAC 10B may thus converge toward a common voltage $V_{cm}$.

Figure 4:
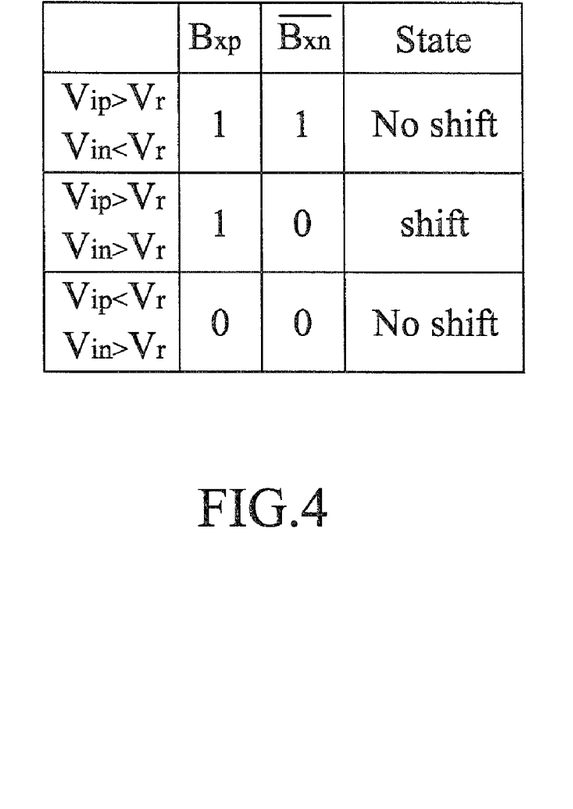
FIG. 4 shows a table generally illustrating the determination of whether directly shifting to the phase corresponding to LSB according to the outputs of the first coarse comparator and the second coarse comparator of FIG. 1.

It is observed that, at time t2 of the phase 2, the output $B_{2p}$ of the first coarse comparator 14A has a logic value of 1 and the output $B_{2n}$ of the second coarse comparator 14B has a logic value of 1 (or $\overline{B}_{2P}=0$). The SAR controller 12 accordingly determines that the first input signal $V_{ip}$ and the second input signal $V_{in}$ are within the predictive window 20, and the analog-to-digital conversion thus bypasses the phases 3 and 4 and goes directly to the phase 5. FIG. 4 shows a table generally illustrating the determination of whether directly shifting to the phase corresponding to LSB according to the outputs $B_{xp}$ of the first coarse comparator 14A and the outputs $B_{xn}$ of the second coarse comparator 14B. Referring back to FIG. 3, due to the bypassing, the outputs $B_{3p}/B_{4p}$ of the first coarse comparator 14A and the outputs $B_{3n}/B_{4n}$ of the second coarse comparator 14B retain their reset value 0 (that is, $B_{3p}=0$, $\overline{B}_{3n}=1$, $B_{4p}=0$, $\overline{B}_{4n}=1$). Thereafter, at time t3 of the phase 5, the output $B_5$ (and other outputs corresponding to LSBs) of the fine comparator 16 is also obtained.

Figure 5:
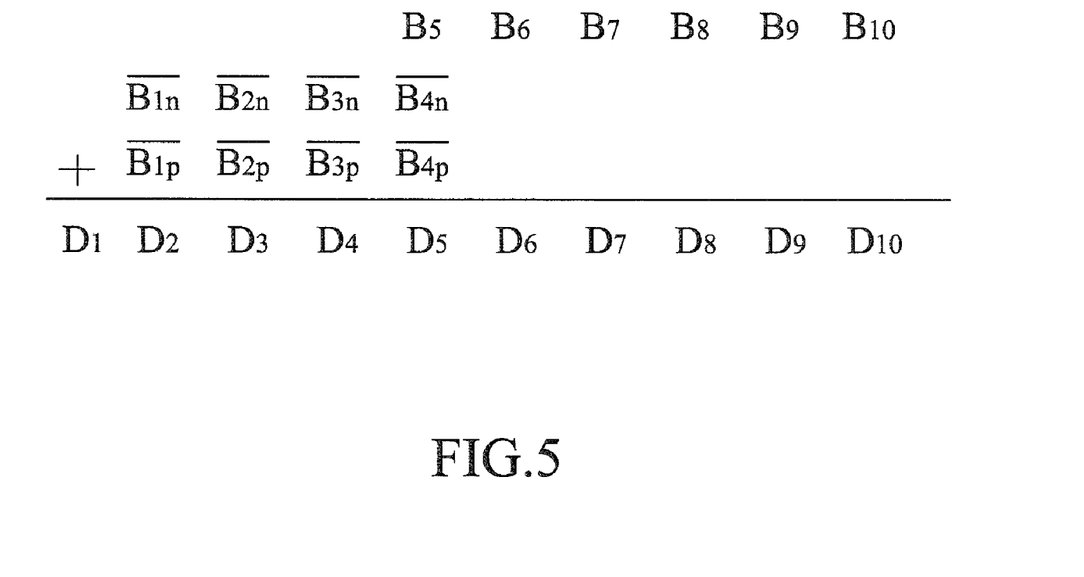
FIG. 5 illustrates a decoding method adopted by the SAR controller of FIG. 1 to decode the outputs of the first coarse comparator, the second coarse comparator, and the fine comparator to obtain a converted output of the SAR ADC.

FIG. 5 illustrates a decoding method adopted by the SAR controller 12 to decode the outputs $B_{1p}$-$B_{4p}$ of the first coarse comparator 14A, the outputs $B_{1n}$-$B_{4n}$ of the second coarse comparator 14B and the outputs $B_5$-$B_{10}$ of the fine comparator 16 to obtain a converted output $D_{out}$ of the SAR ADC (i.e., $D_1$ to $D_{10}$). The MSB $D_1$ is a carry. According to the decoding method, only four full-adders are required to obtain the MSBs $B_2$-$B_5$ of the converted output $D_{out}$.

Figure 6:
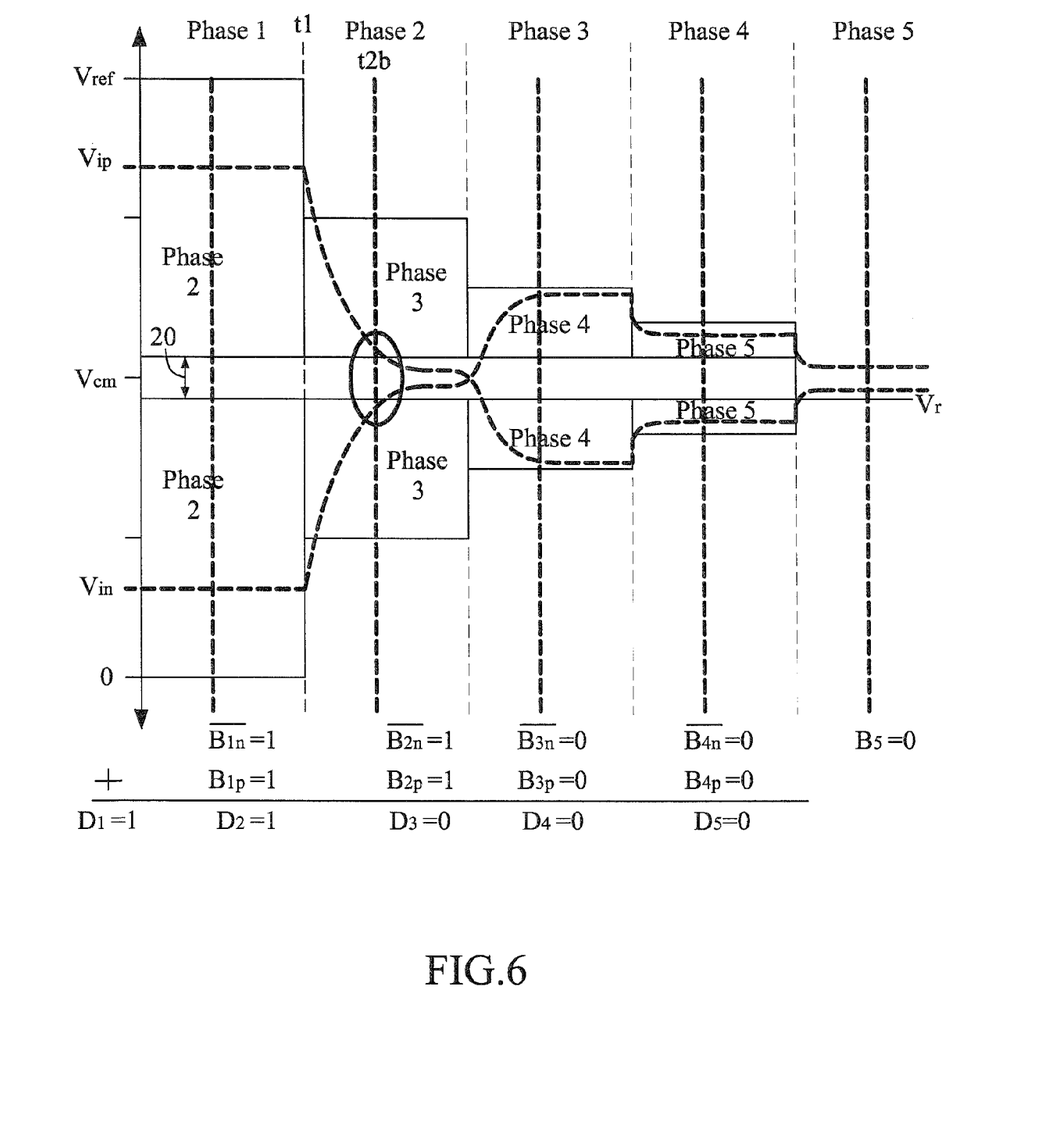
FIG. 6 shows another exemplary phase timing diagram and corresponding outputs of the first coarse comparator, the second coarse comparator, and the fine comparator of FIG. 1.

FIG. 6 shows another exemplary phase timing diagram and corresponding outputs $B_{1p}$-$B_{4p}$ of the first coarse comparator 14A, the outputs $B_{1n}$-$B_{4n}$ of the second coarse comparator 14B and the output $B_5$ of the fine comparator 16. The first input voltage $V_{ip}$ and the second input voltage $V_{in}$ in the example of FIG. 5 are the same as those in FIG. 3, however, the phases 3 and 4 are not bypassed because, at time t2b that is ahead of the time t2 in FIG. 3, the SAR controller 12 determines that the first input signal $V_{ip}$ and the second input signal $V_{in}$ are not within the predictive window 20. Nevertheless, the SAR controller 12 obtains a converted output $D_{out}$ in FIG. 3 being the same as the converted output $D_{out}$ in FIG. 6.

Figure 7A:
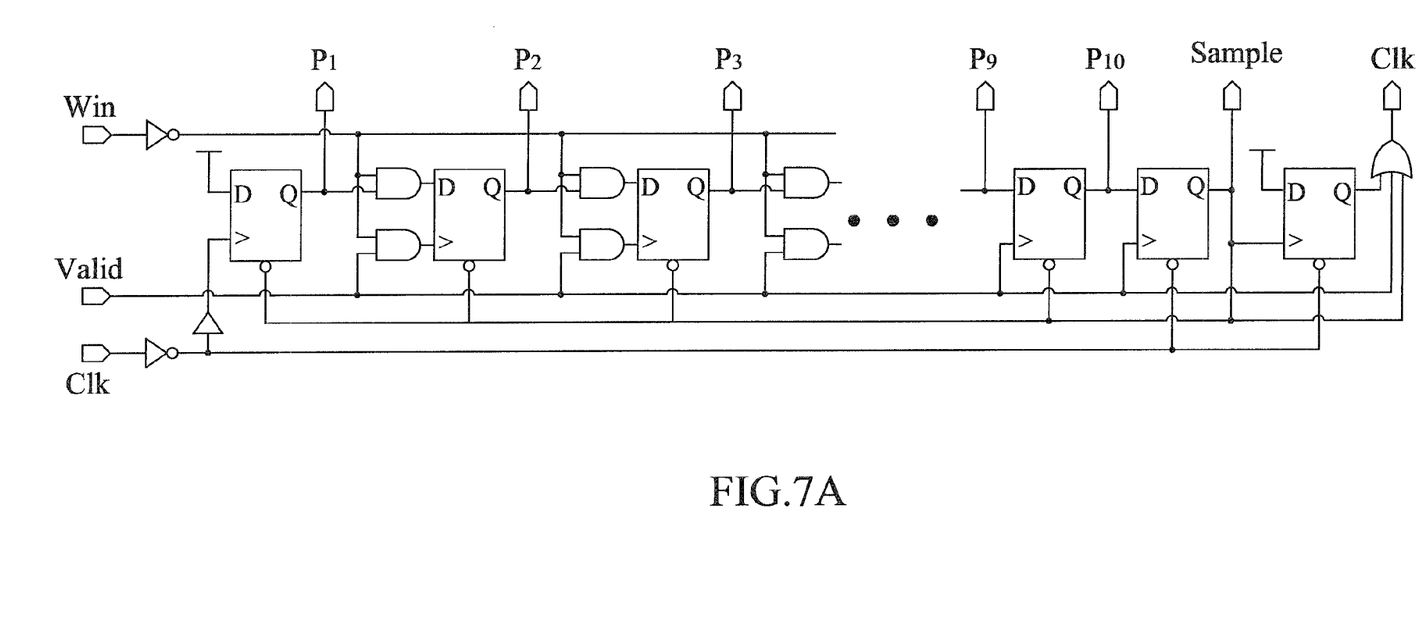
FIG. 7A shows a phase generator adopted in the SAR controller of FIG. 1 for adaptively generating phase control signals.
Figure 7B:
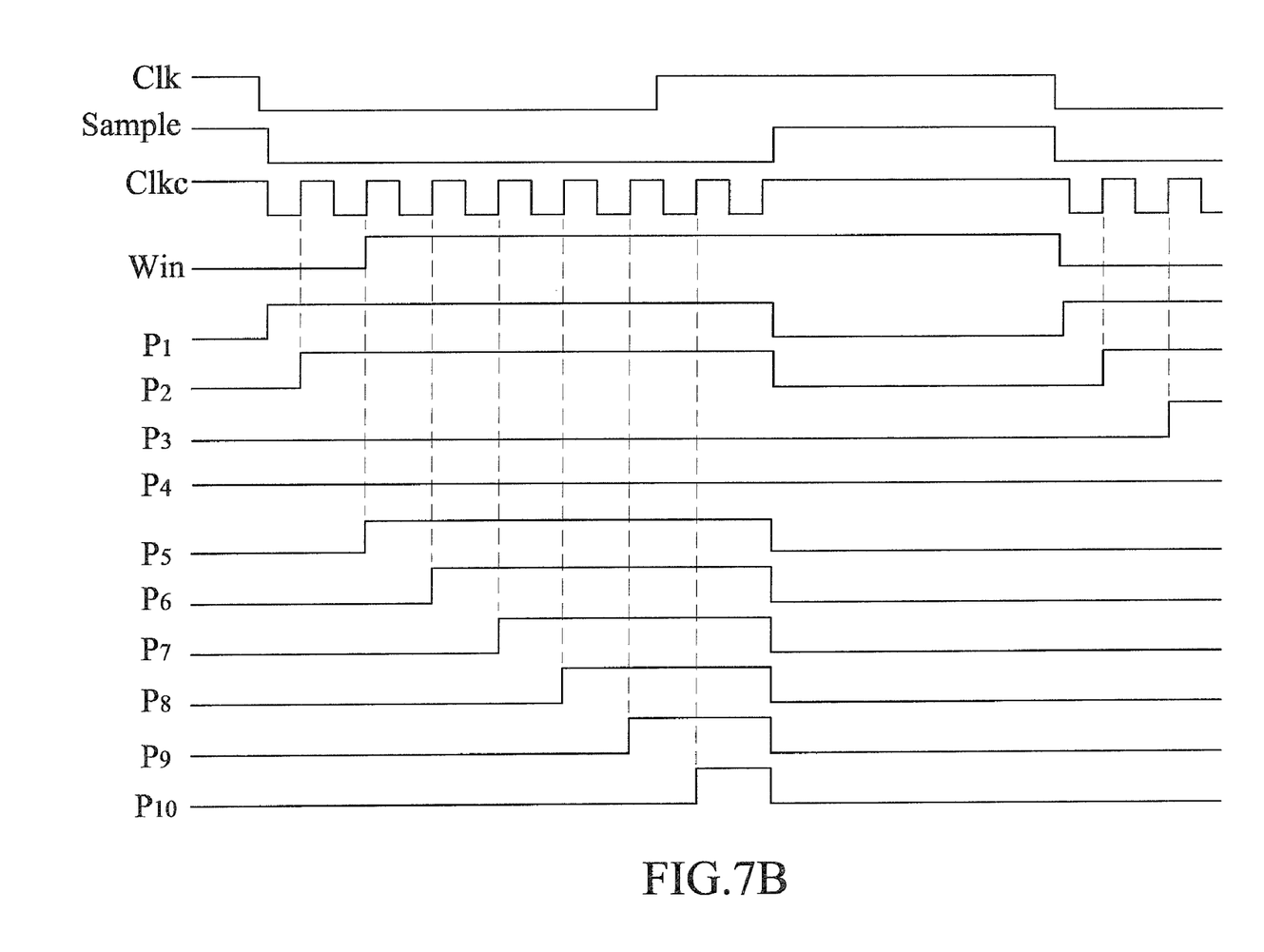
FIG. 7B shows an exemplary timing diagram illustrating the generated phase control signals.

FIG. 7A shows a phase generator adopted in the SAR controller 12 for adaptively generating phase control signals $P_1$-$P_{10}$. The phase generator may be triggered by a signal Valid, which is provided by the first and the second comparators 14A and 14B whenever the comparison is complete. FIG. 7B shows an exemplary timing diagram illustrating the generated phase control signals $P_1$-$P_{10}$, which may be adaptively controlled by a signal Win, which becomes asserted when the outputs $B_{xp}$ and $B_{xn}$ of the first and second coarse comparators 14A and 14B indicate that the first input voltage $V_{ip}$ and the second input voltage $V_{in}$ are within the predictive window 20, for example, $B_{xp}=1$ and $\overline{B}_{xn}=0$. The system has a global clock Clk, according to which a phase signal (Sample) and a clock Clkc are generated. A high-level phase signal (Sample) indicates the sampling phase, and a low-level phase signal (Sample) indicates the converting phase. The clock Clkc is used to control the first coarse comparator 14A, the second coarse comparator 14B, and the fine comparator 16. Phase 1 of the converting phase begins at the rising edge of the phase control signal $P_1$, phase 2 of the converting phase begins at the rising edge of the phase control signal $P_2$, and so on. The phase control signals $P_1$-$P_{10}$ are reset at the rising edge of the phase signal (Sample).

Figure 8:
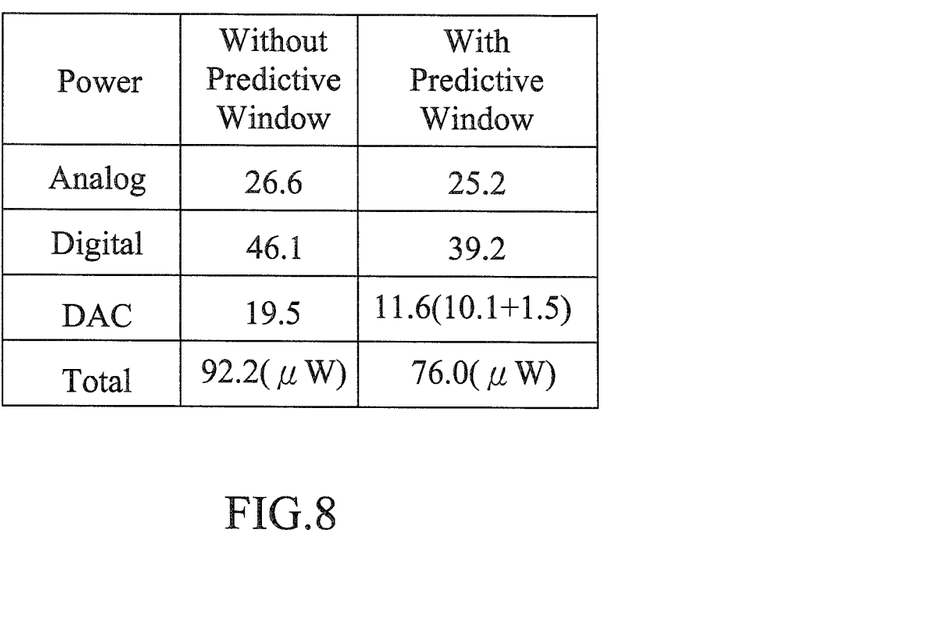
FIG. 8 shows a table illustrating comparison of the power consumption between a SAR ADC without the predictive window and the SAR ADC with the predictive window.

According to the embodiment of the present invention, the operation in FIG. 3 can substantially reduce power consumption of the comparators 14A, 14B, the first and second capacitor DACs 10A, 10B, and the control logic of the SAR controller 12. FIG. 8 shows a table illustrating comparison of the power consumption between a SAR ADC without the predictive window and the SAR ADC with the predictive window.

Figure 9:
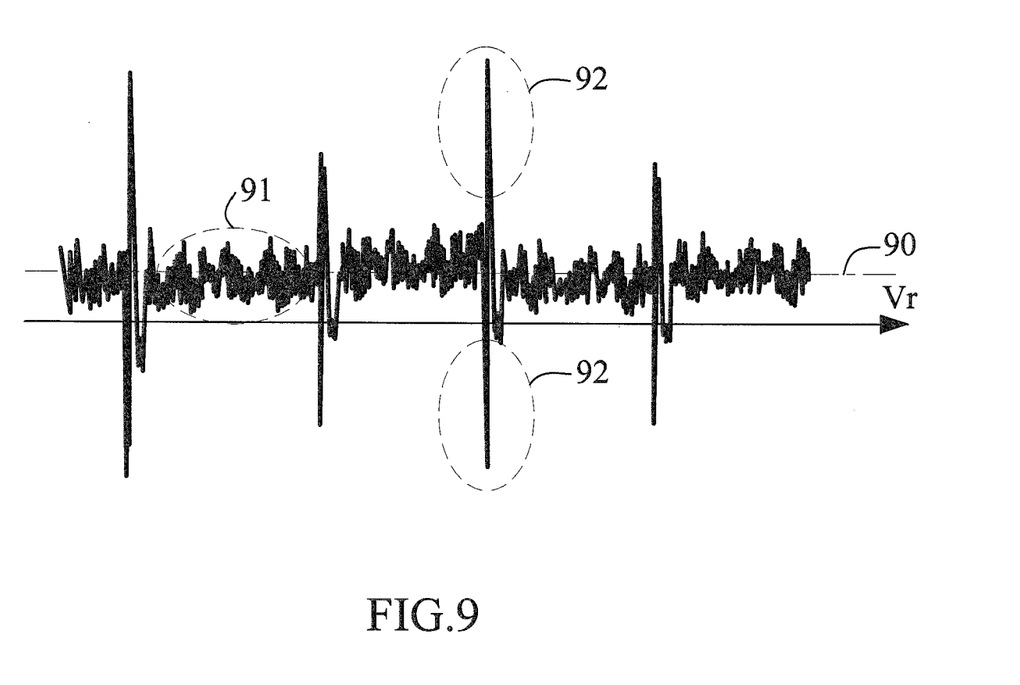
FIG. 9 shows an exemplary signal that may be suitably converted by the embodiment.

The embodiment of the present invention may be suitably adapted to a variety of analog-to-digital conversion applications, and particularly, to the conversion of a signal that has a great portion having low amplitude such as the signal exemplified in FIG. 9. After selecting a proper predictive window centered at the base line 90 of the signal with a window size determined by the window reference voltage $V_r$, the low-amplitude portion 91 of the signal that is within the predictive window may be converted with less power and less time, and the high-amplitude portion 92 of the signal may be converted with high resolution.

Although specific embodiments have been illustrated and described, it will be appreciated by those skilled in the art that various modifications may be made without departing from the scope of the present invention, which is intended to be limited solely by the appended claims.

What is claimed is:

1. A successive approximation register (SAR) analog-to-digital converter (ADC) with a window predictive function, comprising:
   a first capacitor digital-to-analog converter (DAC) coupled to receive a first input signal;
   a second capacitor DAC coupled to receive a second input signal;
   a first coarse comparator configured to compare an output of the first capacitor DAC with a window reference voltage;
   a second coarse comparator configured to compare an output of the second capacitor DAC with the window reference voltage;
   a fine comparator configured to compare the output of the first capacitor DAC with the output of the second capacitor DAC; and
   a SAR controller coupled to receive outputs of the first coarse comparator and the second coarse comparator to determine whether the outputs of the first capacitor DAC and the second capacitor DAC are within a predictive window determined by the window reference voltage, wherein the SAR controller bypasses at least one phase of analog-to-digital conversion of the SAR ADC when the outputs of the first capacitor DAC and the second capacitor DAC are determined to be within the predictive window;
   wherein the SAR controller decodes the outputs of the first coarse comparator, the second coarse comparator and the fine comparator to obtain, a converted output of the SAR ADC.

2. The SAR ADC of claim 1, wherein each of the first capacitor DAC and the second capacitor DAC comprises an array of individually switched capacitors.

3. The SAR ADC of claim 2, in the first or second capacitor DAC, two of said individually switched, capacitors are used for each of phases for obtaining most significant bits (MSBs), and one of said individually switched capacitors is used for each of the remaining phases for obtaining least significant bits (LSBs).

4. The SAR ADC of claim 2, wherein first ends of all the capacitors of the first capacitor DAC are controllably coupled to the first input signal, first ends of all the capacitors of the second capacitor DAC are controllably coupled to the second input signal, and second ends of all the capacitors may be switched to either a first reference voltage or a second reference voltage.

5. The SAR ADC of claim 4, further comprising a plurality of switches configured to control switching of the capacitors under control of the SAR controller.

6. The SAR ADC of claim 4, wherein the output of the first capacitor DAC is derived at a node coupled to the first ends of the capacitors of the first capacitor DAC, and the output of the second capacitor DAC is derived at a node coupled to the first ends of the capacitors of the second capacitor DAC.

7. The SAR ADC of claim 1, wherein the first coarse comparator comprises a first differential operational amplifier that is coupled to receive the output of the first capacitor DAC at a non-inverting input node, and is coupled to receive the window reference voltage at an inverting input node; and the second coarse comparator comprises a second differential operational amplifier that is coupled to receive the output of the second capacitor DAC at a non-inverting input node, and is coupled to receive the window reference voltage at an inverting input node.

8. The SAR ADC of claim 1, wherein the fine comparator comprises a third differential operational amplifier that is coupled to receive the output of the first capacitor DAC at a non-inverting input node, and is coupled to receive the output of the second capacitor DAC at an inverting input node.

9. The SAR ADC of claim 1, wherein the first coarse comparator and the second coarse comparator perform comparison in phases for obtaining most significant bits (MSBs), and the fine comparator performs comparison in the remaining phases for obtaining least significant bits (LSBs).

10. A successive approximation register (SAR) analog-to-digital converting (ADC) method with a window predictive function, comprising:

firstly digital-to-analog converting (DAC) a first input signal, thereby resulting in a first DAC output;

secondly digital-to-analog converting a second input signal, thereby resulting in a second DAC output;

firstly coarse comparing the first DAC output with a window reference voltage, thereby resulting in a first coarse output;

secondly coarse comparing the second DAC output with the window reference voltage, thereby resulting in a second coarse output;

finely comparing the first DAC output with the second DAC output, thereby resulting in a fine output;

receiving the first coarse output and the second coarse output to determine whether the first DAC output and the second DAC output are within a predictive window determined by the window reference voltage, wherein at least one phase of analog-to-digital conversion of the SAR ADC is bypassed when the first DAC output and the second DAC output are determined to be within the predictive window; and decoding the first coarse output, the second coarse output and the fine output to obtain a SAR ADC output.

11. The SAR ADC method, of claim 10, wherein each of the firstly and the secondly digital-to-analog converting steps comprises switching an array of individually switched capacitors.

12. The SAR ADC method of claim 11, in the firstly or the secondly digital-to-analog converting step, two of said individually switched capacitors are used for each of phases for obtaining most significant bits (MSBs), and one of said individually switched capacitors is used for each of the remaining phases for obtaining least significant bits (LSBs).

13. The SAR ADC method of claim 10, wherein the firstly coarse comparing step and the secondly coarse comparing step are performed in phases for obtaining most significant bits (MSBs), and the finely comparing step is performed in the remaining phases for obtaining least significant bits (LSBs).

* * * * *